United States Patent
Saiyajitara et al.

(10) Patent No.: US 10,763,203 B1
(45) Date of Patent: Sep. 1, 2020

(54) CONDUCTIVE TRACE DESIGN FOR SMART CARD

(71) Applicant: NXP B.V., Eindhoven (NL)

(72) Inventors: Amornthep Saiyajitara, Bangkok (TH); Wiwat Tanwongwan, Bangkok (TH); Nathapop Lappanitpullpol, Pathumthanee (TH)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/270,607

(22) Filed: Feb. 8, 2019

(51) Int. Cl.
*H01L 23/498* (2006.01)
*H01L 23/00* (2006.01)

(52) U.S. Cl.
CPC .. *H01L 23/49855* (2013.01); *H01L 23/49861* (2013.01); *H01L 24/48* (2013.01); *H01L 2224/48235* (2013.01)

(58) Field of Classification Search
CPC .................................................. H01L 23/49855
See application file for complete search history.

(56) References Cited

U.S. PATENT DOCUMENTS

| | | | |
|---|---|---|---|
| 4,356,627 A | 11/1982 | Hoffman | |
| 5,477,086 A * | 12/1995 | Rostoker | H01L 23/49811 257/673 |
| 6,037,667 A * | 3/2000 | Hembree | H01L 23/49811 257/692 |
| 6,353,420 B1 * | 3/2002 | Chung | B32B 3/08 343/895 |
| 6,376,769 B1 * | 4/2002 | Chung | B32B 3/08 174/260 |
| 6,384,425 B1 | 5/2002 | Huber et al. | |
| 6,388,208 B1 * | 5/2002 | Kiani | H05K 1/0222 174/260 |
| 6,420,660 B1 | 7/2002 | Sauer et al. | |
| 6,568,600 B1 | 5/2003 | Carpier et al. | |
| 7,049,693 B2 * | 5/2006 | Canella | G01R 1/0466 257/690 |
| 7,683,495 B2 * | 3/2010 | Zhong | H01L 23/5382 257/698 |
| 7,767,913 B2 * | 8/2010 | Corisis | H01L 23/49827 174/262 |
| 7,830,018 B2 * | 11/2010 | Lee | H01L 23/49827 257/774 |
| 7,855,895 B2 | 12/2010 | Kim et al. | |

(Continued)

FOREIGN PATENT DOCUMENTS

WO 2017194200 11/2017

*Primary Examiner* — Eugene Lee

(57) ABSTRACT

A lead frame for assembling a smart card is formed with a substrate having first and second opposing major surfaces. A die receiving area is formed in the first major surface of the substrate and surrounded by conductive vias. A conductive coating is formed on the second major surface of the substrate and patterned to form electrical contact pads over the conductive vias. A conductive trace is formed on the first major surface of the substrate. The conductive trace extends between at least two adjacent vias and partially surrounds the at least two adjacent conductive vias, thereby forming a gap in the portion of the trace that surrounds the vias. An electrical connection between an integrated circuit chip and the conductive via extends over the gap. The gap prevents the electrical connection from inadvertently contacting the conductive trace.

18 Claims, 6 Drawing Sheets

(56) References Cited

U.S. PATENT DOCUMENTS

| | | | |
|---|---|---|---|
| 8,487,426 B2* | 7/2013 | Essig | H01L 23/488 257/698 |
| 8,853,848 B2* | 10/2014 | Wu | H05K 1/0222 257/690 |
| 10,212,805 B2* | 2/2019 | Yamada | H05K 1/115 |
| 2002/0005583 A1* | 1/2002 | Harada | H01L 24/03 257/758 |
| 2004/0251047 A1* | 12/2004 | Bartley | H05K 1/115 174/262 |
| 2005/0133251 A1* | 6/2005 | Chiu | H05K 1/115 174/259 |

* cited by examiner

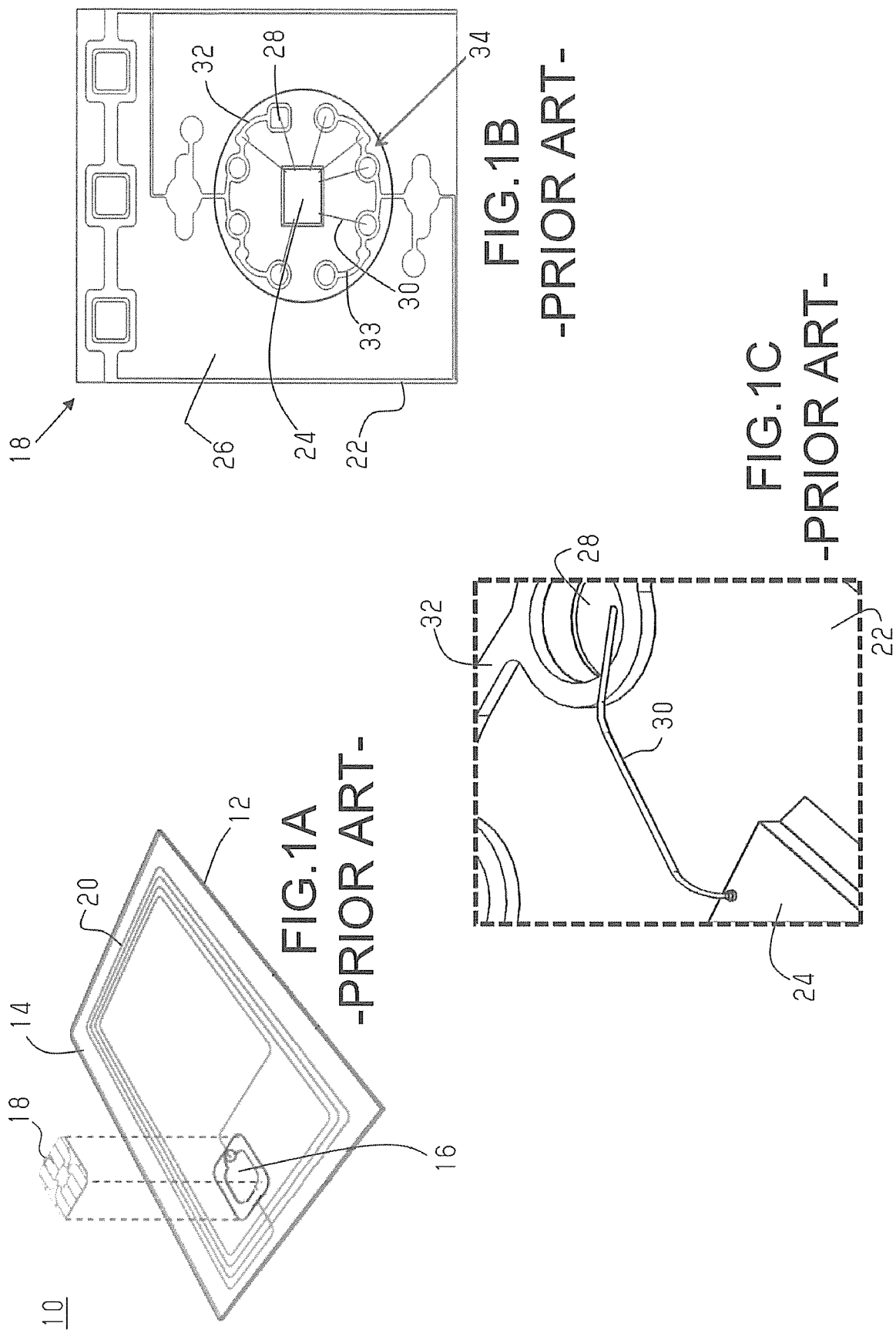

US 10,763,203 B1

CONDUCTIVE TRACE DESIGN FOR SMART CARD

BACKGROUND

The present invention generally relates to smart cards, and, more particularly, to a conductive trace design for a smart card.

Referring to FIG. 1A, a smart card 10 having a credit-card sized body 12 with a first major surface 14 that includes an integrated circuit (IC) module receiving area 16 for receiving an IC module 18, and an antenna 20 is shown. FIG. 1B is a top plan view of the IC module 18 before being singulated from a carrier 22. The IC module 18 includes an IC 24, which may be a microcontroller with some memory, mounted on a substrate or lead frame 26, which is a part of the carrier 22. The substrate 26 includes a plurality of vias 28 that allow conductive pads on the active surface of the IC 24 to be electrically connected to contact pads on the opposite side of the substrate 26 with bond wires 30. By including both the antenna 20 and the contact pads, the smart card allows for both contact and contactless connections.

The vias 28 typically comprise plated through holes. One or more conductive traces 32 and 33 are formed on the surface of the substrate 26 and form connections between the IC 24 and the antenna 20. The conductive traces 32 and 33 travel from one via to an adjacent via and so on, as shown in FIG. 1B. The conductive traces 32 and 33 also surround the vias 28, as shown in FIG. 1C, which is a greatly enlarged plan view of the via 28, a bond wire 30 connecting the IC 24 to the via 28, and the conductive trace 32.

Smart card packages have a problem in that sometimes one of the bond wires 30 can sag and inadvertently touch the conductive trace 32, also as shown in FIG. 1C, causing a short circuit condition that may cause the smart card to operate incorrectly. Accordingly, it would be desirable to be able to assembly smart cards that will not have inadvertent short circuits caused by a bond wire inadvertently contacting the conductive trace 32.

BRIEF DESCRIPTION OF THE DRAWINGS

So that the manner in which the features of the present invention can be understood in detail, a detailed description of the invention is provided below with reference to embodiments, some of which are illustrated in the appended drawings. The appended drawings illustrate only typical embodiments of the invention and are therefore not to be considered limiting of its scope, for the invention may admit to other equally effective embodiments. Further, the drawings are for facilitating an understanding of the invention and thus are not necessarily drawn to scale, and some features may be omitted in order to highlight other features of the invention so that the invention may be more clearly understood. Advantages of the subject matter claimed will become apparent to those skilled in the art upon reading this description in conjunction with the accompanying drawings, in which like reference numerals have been used to designate like elements, and in which:

FIG. 1A is a perspective view illustrating a conventional smart card assembly and an IC module therefor, FIG. 1B is an enlarged plan view of one side of the IC module of FIG. 1A, and FIG. 1C is a greatly enlarged view of a portion of the IC module of FIG. 1B with a bond wire thereof contacting a conductive trace thereof;

DETAILED DESCRIPTION

In one embodiment, the present invention provides a lead frame for assembling a smart card. The lead frame is formed with a substrate having first and second opposing major surfaces. A die receiving area is formed in the first major surface of the substrate and surrounded by conductive vias. A conductive coating is formed on the second major surface of the substrate and patterned to form electrical contact pads over the conductive vias. A conductive trace is formed on the first major surface of the substrate. The conductive trace extends between at least two adjacent vias and partially surrounds the at least two adjacent conductive vias, thereby forming a gap in the portion of the trace that surrounds the vias. An electrical connection between an integrated circuit chip and the conductive via extends over the gap. The gap prevents the electrical connection from inadvertently contacting the conductive trace.

In another embodiment, the present invention provides a smart card, including a substrate having first and second opposing major surfaces and a die receiving area formed in the first major surface. A plurality of conductive vias are provided that generally surround the die receiving area and extend from the first major surface to the second major surface. A conductive coating is formed on the second major surface of the substrate and is patterned to form a plurality of electrical contact pads over the plurality of conductive vias. There is at least one conductive trace formed on the first major surface of the substrate and extends between at least two adjacent vias. The conductive traces only partially surround the at least two adjacent conductive vias. An integrated circuit chip is disposed within the die receiving area and electrically connected to the vias with a plurality of electrical connections that extend between bonding pads on an active surface of the chip and the vias. The portions of the conductive trace that partially surround the adjacent conductive vias are configured so that the electrical connections that extend from the chip to the two adjacent conductive traces extend over portions of the conductive vias that are not surrounded by the conductive traces.

Thus, the present invention provides a smart card with a modified conductive trace design to avoid and prevent electrical shorting between a bond wire and the conductive trace. The present invention provides the advantage of preventing a bond wire from contacting the conductive trace even if the wire sags. The present invention also makes it easier to control wire loop shape.

Figure 2C:
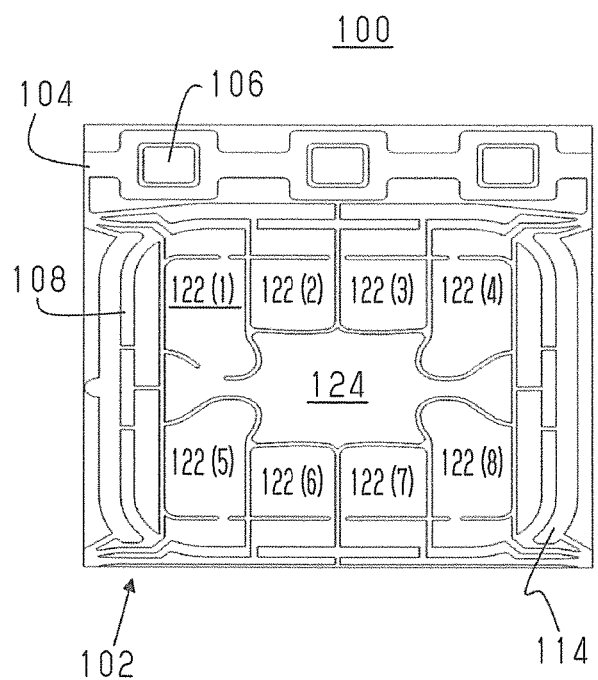
FIG. 2C is a top plan view of the portion of the carrier of FIG. 2B.
Figure 2B:
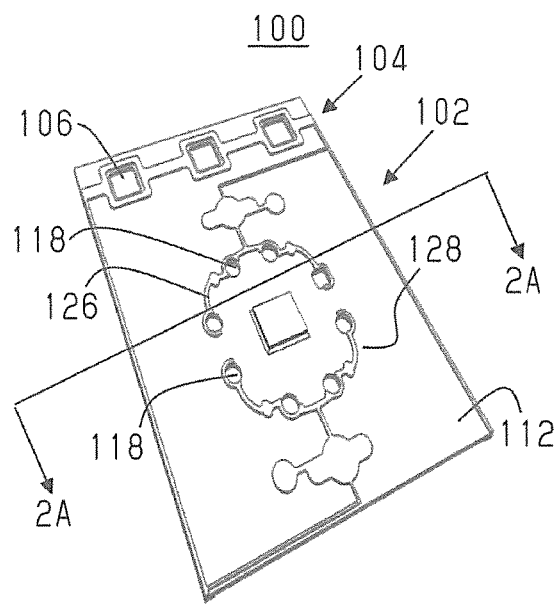
FIG. 2B is a bottom plan view of a portion of the lead frame carrier of FIG. 2A.
Figure 2A:
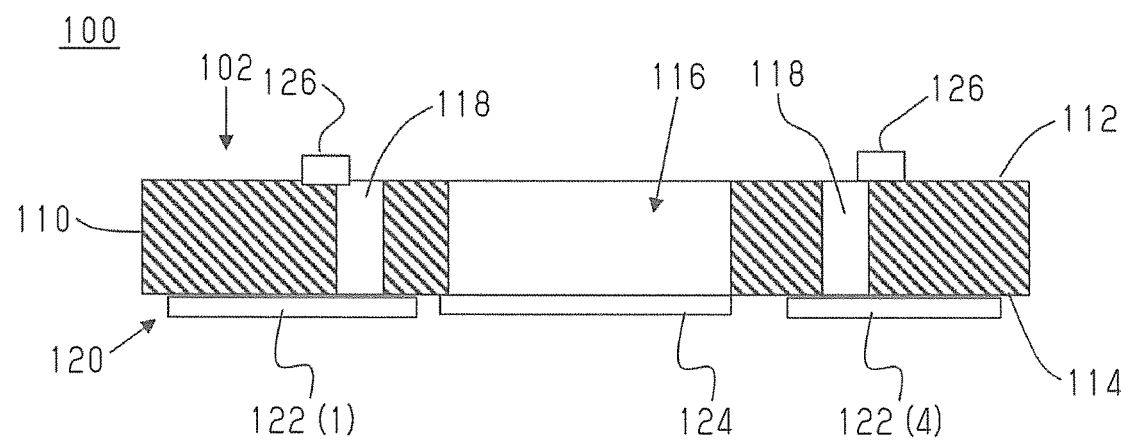
FIG. 2A is a cross-sectional side view of a lead frame carrier in accordance with an embodiment of the present invention.

Referring now to FIGS. 2A, 2B and 2C, FIG. 2A is a cross-sectional side view of a lead frame carrier 100 in accordance with an embodiment of the present invention, FIG. 2B is a bottom plan view of the portion of the lead frame carrier 100, and FIG. 2C is a top plan view of the portion of the lead frame carrier 100. The portion of the lead frame carrier 100 includes a lead frame 102 and a track 104 including a plurality of aligned holes 106 provided for moving the carrier 100 with a sprocket (not shown). The carrier 100 may comprise a strip of lead frames or a strip having more than one row of lead frames and another track with holes on an opposing side of the carrier. The lead frame strip 100 is of a type well known in the art, so detailed description of those elements of the lead frame strip 100 that are not particularly pertinent to understanding the present invention will not be described so as not to obscure the invention. An outline 108 of the lead frame 102 is shown in FIG. 2C. The lead frame 102 may be used in a smart card assembly process, as will be discussed in detail below. The lead frame 102 may be separated from the carrier 100 by punching or cutting, also as is known in the art.

The lead frame 102 includes a substrate 110 having a first major surface 112 (FIG. 2B) and a second, opposing major surface 114 (FIG. 2C). As used herein, substrate means an underlying substance or layer, or a primary or underlying material on which other materials (e.g., conductive ink, conductive metal, mold compound, etc.) are applied. The substrate 110 is made of a nonconductive material such as glass-reinforced epoxy laminate material (i.e., FR4).

A die receiving area 116 is formed in the first major surface 112 of the substrate 110, as are a plurality of conductive vias 118 that generally surround the die receiving area 116, as shown in FIG. 2B. The die receiving area 116 comprises a cavity formed in a generally central location of the lead frame 102. The die receiving area 116 may have a depth that is less than about one-half of a thickness of the substrate 110. Alternatively, the depth of the cavity may be more than one-half the thickness of the substrate 110, and in a preferred embodiment, the cavity extends completely through the substrate 110. The conductive vias 118 also extend completely through the substrate 110. The vias 118 may be plated through holes, as are known in the art, or through holes that are filled with an electrically conductive material such as solder.

Figure 6:
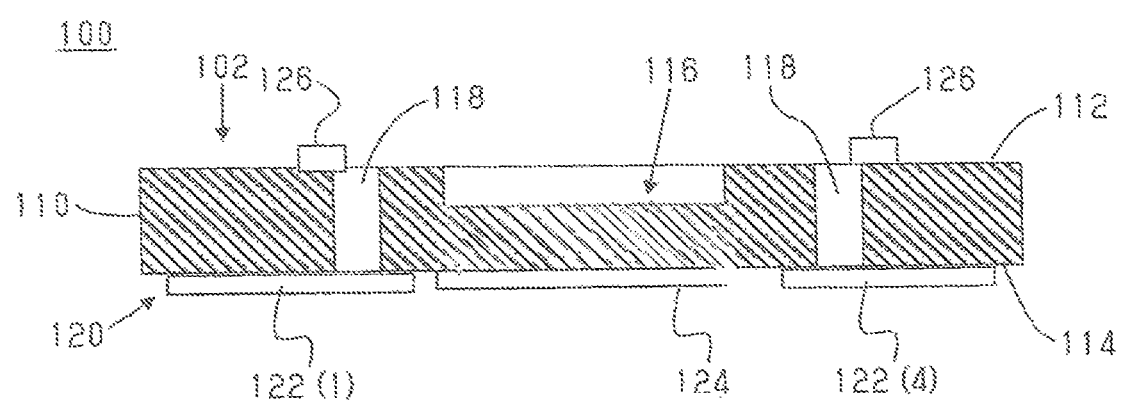
FIG. 6 is a cross-sectional side view of a lead frame carrier in accordance with another embodiment of the present invention.

FIG. 6 is a cross-sectional side view of a lead frame carrier in accordance with another embodiment of the present invention. In the embodiment of FIG. 6, the die receiving area 116 has a depth that is less than about one-half of a thickness of the substrate 110.

In the presently preferred embodiment and as illustrated in FIG. 2B, the conductive vias 118 comprise two sets of conductive vias disposed on opposing sides of the die receiving area 116. For example, FIG. 2B shows two sets of the vias 118, where each set includes four (4) of the vias 118. The sets are defined by the vias associated with a conductive trace, as discussed below. As will be understood by those of skill in the art, the number of vias 118 both per set and as a whole will depend on the number of bonding pads of an integrated circuit used to assemble a smart card are needed to be accessed.

A conductive coating 120 is formed on the second major surface 114 of the substrate 110. The conductive coating 120 is patterned to form a plurality of electrical contact pads 122(1) to 122(8) over respective ones of the conductive vias 118. The conductive coating 120 also covers the cavity of the die receiving area 116 to form a die pad or die flag 124 such that a major surface of an integrated circuit chip disposed within the cavity rests on the conductive coating 120. The die pad or flag 124 typically is sized and shaped to receive the IC chip, i.e., based on the size and shape of the chip. However, the size and shape of the die pad 124, and the size and type of IC chip are not part of the present invention, so will not be described in further detail herein.

As will be understood by those of skill in the art, there are gaps located between portions of the conductive coating 120 extending over the conductive vias 118 and the portion over the cavity 116 so that the contact pads 122 are electrically isolated from each other and from the die pad 124.

In one embodiment, the conductive coating 120 comprises copper foil attached to the second major surface 114 of the substrate 110 with an adhesive (not shown). The conductive coating or copper foil 12o may include a corrosion resistant coating to prevent oxidation of the copper, such as Ni, Pd and/or Au.

At least one conductive trace 126 is formed on the first major surface 112 of the substrate 110, and in a preferred embodiment, there are first and second conductive traces 126 and 128 (see FIG. 2B). Each of the conductive traces 126, 128 extends between at least two adjacent vias 118 and partially surround the vias 118, but the conductive traces 126, 128 do not fully surround the vias 118.

As previously discussed, the vias 118 may be divided into two sets, and these sets are defined as those vias associated with one or the other of the two conductive traces 126 and 128. Thus, the first conductive trace 126 extends between and partially surrounds each of the conductive vias 118 of the first set and the second conductive trace 128 extends between and partially surrounds each of the conductive vias 118 of the second set. As will be apparent to those of skill in the art, the first set of vias are associated with the contact pads 122(1)-122(4) and the second set of vias are associated with the contact pads 122(5)-122(8).

Figure 3B:
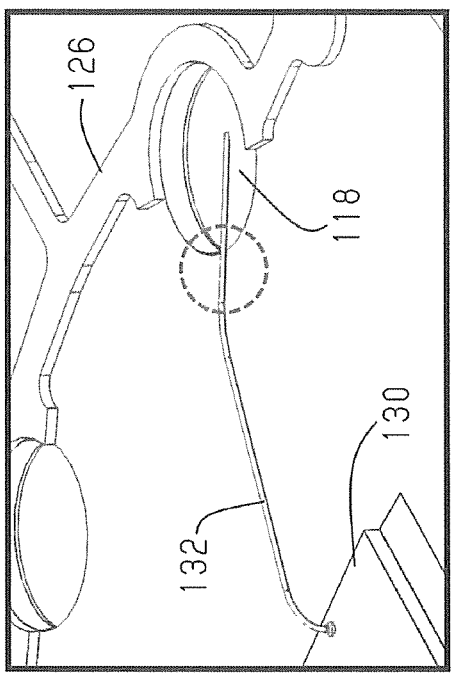
FIG. 3B is a greatly enlarged view of a via, conductive trace, and bond wire of the assembly of FIG. 3A.
Figure 3A:
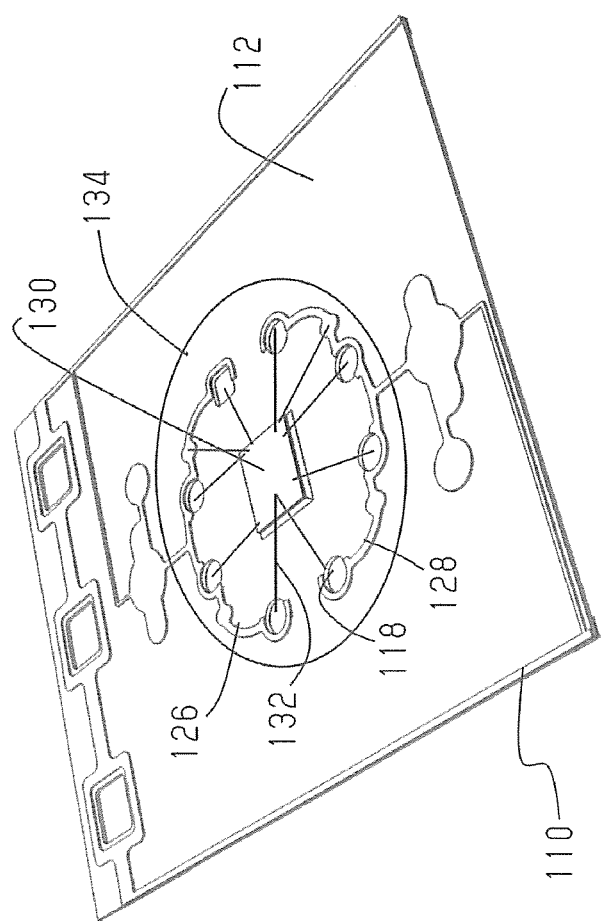
FIG. 3A shows the top side of the carrier and lead frame of FIG. 2B after attaching an IC thereto and electrically connecting the IC to vias thereof with bond wires.

Referring briefly to FIGS. 3A and 3B, FIG. 3A shows the first surface 112 of the substrate 110 with an integrated circuit (IC) chip 130 disposed within the cavity of the die receiving area 116 and attached to an inner surface of the die flag 124 with a die attach adhesive or a die attach tape. The IC chip 130, which may comprise any type of integrated circuit, such as a simple microprocessor with a small memory, has bonding pads (not shown) on an active surface thereof that are electrically connected to the contact pads 122 by way of the vias 118 with electrical connection means 132. In a preferred embodiment, the electrical connection means comprise bond wires, but in alternative embodiments, other electrical connection means may be used, such as a conductive ink.

A plastic mold compound or an encapsulant 134 may be formed over the first major surface 112 of the substrate 110, where the encapsulant covers the IC chip 130, the conductive vias 118, the first and second conductive traces 126 and 128, and the electrical connections 132 between the IC chip 130 and the conductive vias 118.

FIG. 3B is a greatly enlarged view of a via 118, a portion of the first conductive trace 126, and a bond wire 132 of the assembly shown in FIG. 3A. As illustrated, the conductive trace 126 extends from one via 118 to another via, and also partially surrounds each of the vias 118. In one embodiment, the conductive traces extend about half way around the vias 118, and in another embodiment, the conductive traces extend more than half way around the vias. However, in each embodiment, there is a gap or portion of the outer perimeter of the vias that the conductive trace does not extend around. The portions of the conductive traces 126 and 128 that partially surround the conductive vias 118 are configured so that the bond wires 132 that extend from the IC chip 130 to the vias 118 do not extend over the conductive traces. That is, the bond wires 132 extend over portions of the conductive vias 118 that are not surrounded by the conductive traces 126 or 128. Thus, if the bond wire 132 happens to sag or have an especially low loop height, it still will not inadvertently contact the conductive trace.

Figure 4A:
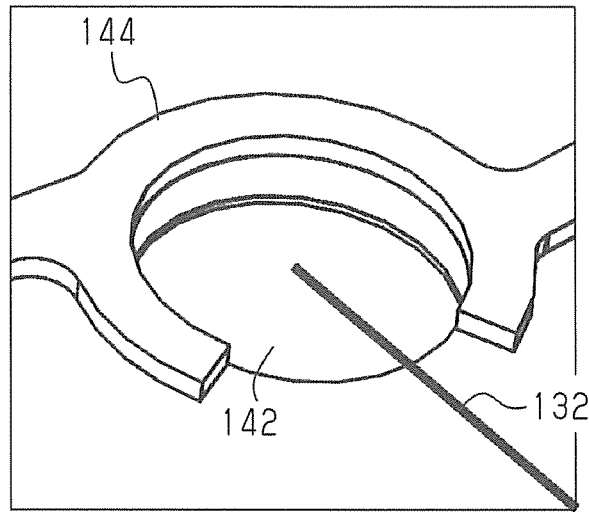
FIGS. 4A, 4B, 4C and 4D illustrate vias and conductive traces in accordance with various embodiments of the present invention.
Figure 4B:
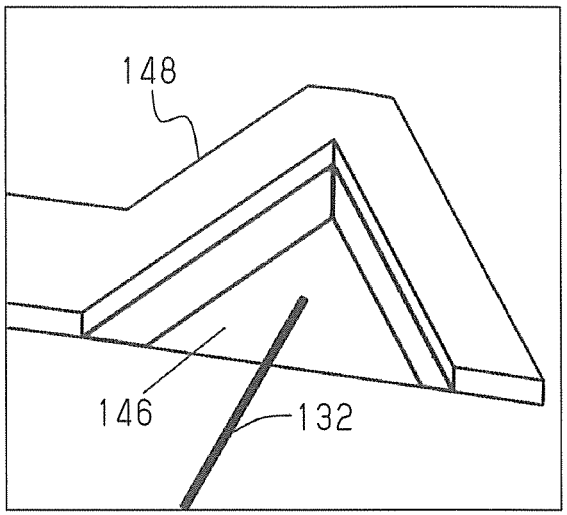
Figure 4C:
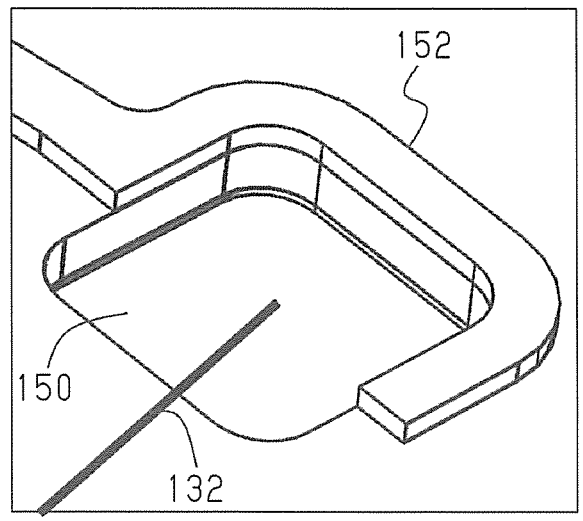
Figure 4D:
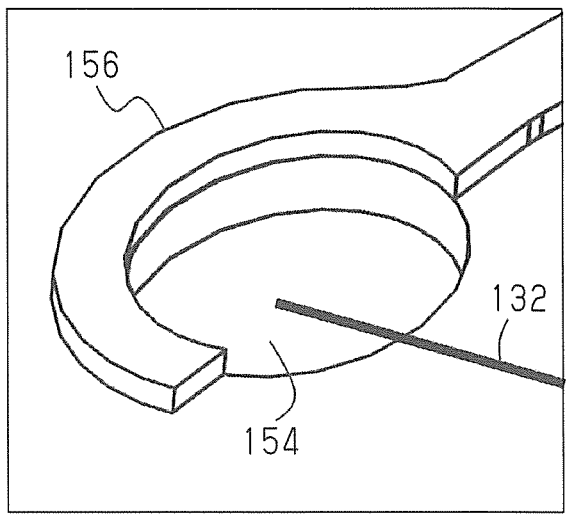

FIGS. 4A, 4B, 4C and 4D illustrate vias and conductive traces in accordance with various embodiments of the present invention. FIG. 4A shows a round-shaped via 142 and a conductive trace 144 that extends along more than half the diameter of the via 142, but still has a gap for accommodating bond wire 132. FIG. 4B shows a triangular-shaped via 146 and a conductive trace 148 that extends along two sides of the triangular via 146, but the trace 148 does not extend along the third side of the triangular-shaped via 146 so that the bond wire 132 cannot inadvertently contact the bond wire 132. FIG. 4C shows a rectangular or square shaped via 150 and a conductive trace 152 that extends fully along one side and partially along two sides of the rectangle and provides a gap along portions of two sides and an intermediate side thereto for accommodating bond wire 132. FIG. 4D shows a round or circular-shaped via 154 and a conductive trace 156 that extends along only about one-half of the diameter of the via 154 and leaves a gap for accommodating bond wire 132. Thus, as will be apparent to those of skill in the art, the invention is not limited by the shape of the via.

Figure 5:
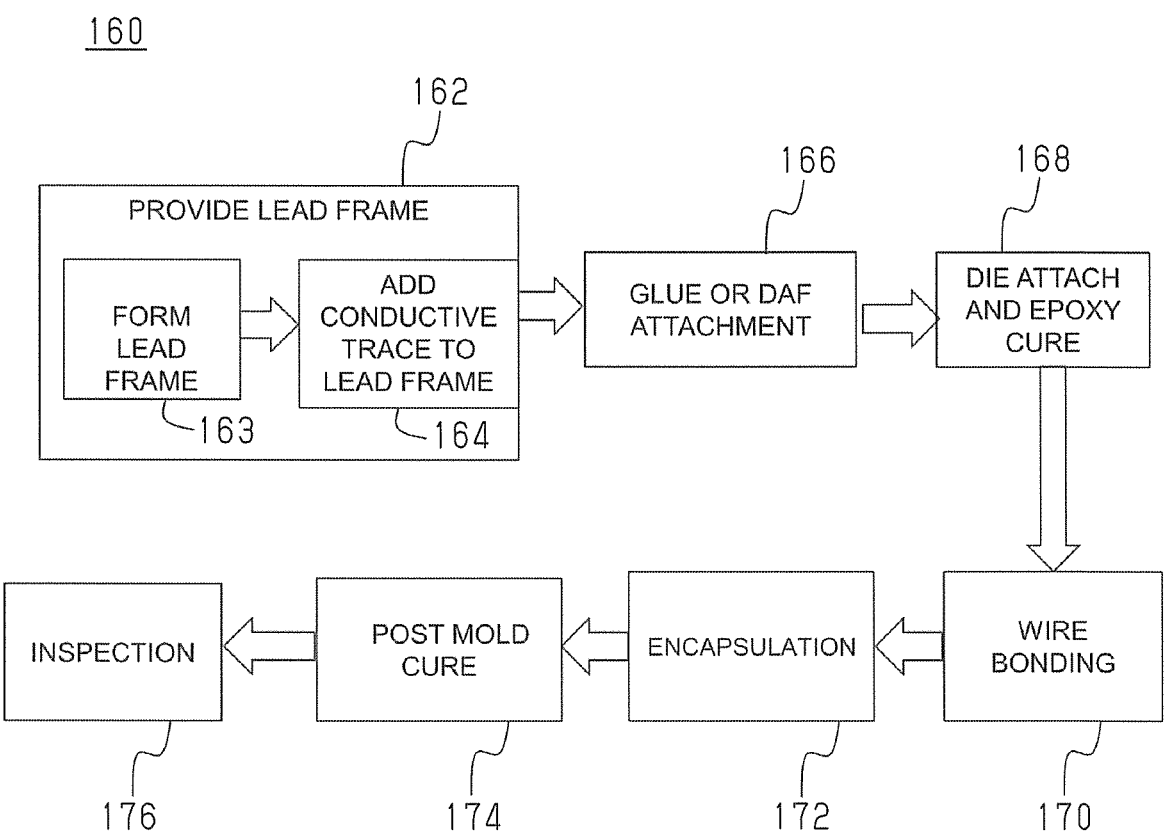
FIG. 5 is a flow chart illustrating various steps in a smart card assembly process in accordance with an embodiment of the present invention.

FIG. 5 is a flow chart illustrating various steps in a smart card assembly process 160 in accordance with an embodiment of the present invention. Starting at the upper left side of FIG. 5, in a first step 162, a lead frame for assembling a smart card is provided. The lead frame is similar to a conventional smart card lead frame (FIG. 1B) and formed at sub-step 163. However, at sub-step 164, a conductive trace in accordance with embodiments of the present invention is added to the lead frame, where the trace(s) extend between vias and partially, but do not fully surround the vias, leaving a gap in a location where a bond wire will pass from an integrated circuit to the via.

At step 166, an adhesive or die attach film (DAF) is placed in the die receiving area on the encapsulation side of the lead frame, and at step 168 a die is attached in the die receiving area using the adhesive or DAF. The adhesive is cured so that the die is securely attached to the lead frame. At step 170, the die is electrically connected to the vias in the lead frame. In the presently preferred embodiment, a standard wire bonding process is used to attach bond wires to die bonding pads and respective lead frame vias. At step 172, an encapsulant is formed over the die, bond wires and vias (see FIG. 3A). For example, a glob top encapsulation process may be performed whereby a liquid encapsulant is dispensed over the die, bond wires and vias. At step 174, which is optional, the molding compound/encapsulant may be removed. Finally, at step 176, the finished device is inspected.

The conductive traces of the present invention may be formed using a number of known methods, such as by printing and etching. The conductive traces only partially surround the vias to which bond wires are attached, which prevents inadvertent shorting of the bond wires to the conductive traces.

The integrated circuit chip and the electrical connections (bond wires) are covered with a molding compound, thereby forming assembled devices. The molding compound provides electrical and mechanical protection to the integrated circuit chip, the lead frame and the electrical connections between the chip and the vias. In one embodiment, the molding compound comprises an epoxy-resin composition, for example a C-stage plastic material (Resite). The molding compound subsequently is cured to be physically hard, so that the chip, the vias, the conductive traces and the bond wires covered by the molding compound are protected from potential environmental influences like moisture and dust, as well as mechanical damage. The molding compound may be formed over the chip using known methods, such as transfer molding or a glob top process.

This invention can be applied to any smartcard packages or MEMS packages, and will fit with any die size and shape, number of dies, and stacked dies.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein.

Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

The invention claimed is:

1. A lead frame for assembling a smart card, the lead frame comprising:
   a substrate having first and second opposing major surfaces;
   a die receiving area formed in the first major surface of the substrate;
   a plurality of conductive vias that generally surround the die receiving area;
   a conductive coating formed on the second major surface of the substrate, wherein the conductive coating is patterned to form a plurality of electrical contact pads over the plurality of conductive vias; and
   at least one conductive trace formed on the first major surface of the substrate, wherein the conductive trace extends between at least two adjacent vias and wherein the conductive traces does not fully surround the at least two adjacent conductive vias;

wherein the portions of the conductive traces that partially surround said at least two adjacent conductive vias are configured so that bond wires that extend from an integrated circuit chip to said at least two adjacent conductive traces extend over portions of the conductive vias that are not surrounded by the conductive traces.

2. The lead frame of claim 1, wherein the conductive vias are one of round, oval, rectangular and triangular.

3. The lead frame of claim 1, wherein the at least one conductive trace extends about half way around said at least two adjacent conductive vias.

4. The lead frame of claim 3, wherein the at least one conductive trace extends more than half way around said at least two adjacent conductive vias.

5. The lead frame of claim 1, wherein:
the plurality of conductive vias comprises two sets of conductive vias disposed on opposing sides of the die receiving area; and
the at least one conductive trace comprises a first conductive trace that extends between and partially surrounds each of the conductive vias of the first set and a second conductive trace that extends between and partially surrounds each of the conductive vias of the second set.

6. The lead frame of claim 1, wherein the die receiving area comprises a cavity having a depth that is less than about one-half of a thickness of the substrate.

7. The lead frame of claim 1, wherein the conductive coating formed on the second major surface of the substrate extends over the cavity such that a major surface of an integrated circuit chip disposed within the cavity rests on the conductive coating.

8. The lead frame of claim 7, wherein the conductive coating also extends over the conductive vias and includes gaps located between portions extending over the conductive vias and the portion over the cavity.

9. The lead frame of claim 8, wherein the conductive coating comprises copper foil attached to the second major surface of the substrate with an adhesive.

10. The lead frame of claim 8, wherein the conductive coating includes a corrosion resistant coating to prevent oxidation of the copper.

11. A smart card, comprising:
a substrate having first and second opposing major surfaces;
a die receiving area formed in the first major surface of the substrate;
a plurality of conductive vias that generally surround the die receiving area, wherein the conductive vias extend from the first major surface to the second major surface;
a conductive coating formed on the second major surface of the substrate, wherein the conductive coating is patterned to form a plurality of electrical contact pads over the plurality of conductive vias;
at least one conductive trace formed on the first major surface of the substrate, wherein the conductive trace extends between at least two adjacent vias and wherein the conductive traces does not fully surround the at least two adjacent conductive vias;
an integrated circuit chip disposed within the die receiving area; and
a plurality of electrical connections that electrically connect the integrated circuit chip to respective ones of the conductive vias, wherein the portions of the at least one conductive trace that partially surround said at least two adjacent conductive vias are configured so that bond wires that extend from the integrated circuit chip to said at least two adjacent conductive traces extend over portions of the at least two adjacent conductive vias that are not surrounded by the conductive traces.

12. The smart card of claim 11, wherein the at least one conductive trace extends about half way around said at least two adjacent conductive vias.

13. The smart card of claim 12, wherein the at least one conductive trace extends more than half way around said at least two adjacent conductive vias.

14. The smart card of claim 11, wherein the conductive vias are one of round, oval, rectangular and triangular.

15. The smart card of claim 11, wherein:
the plurality of conductive vias comprises two sets of conductive vias disposed on opposing sides of the die receiving area; and
the at least one conductive trace comprises a first conductive trace that extends between and only partially surrounds each of the conductive vias of the first set and a second conductive trace that extends between and only partially surrounds each of the conductive vias of the second set.

16. The smart card of claim 11, wherein the die receiving area comprises a cavity having a depth that is less than about one-half of a thickness of the sub half of a thickness of the substrate.

17. The smart card of claim 11, wherein the conductive coating formed on the second major surface of the substrate extends over the cavity such that a bottom surface of the integrated circuit chip disposed within the cavity rests on the conductive coating.

18. The smart card of claim 11, further comprising an encapsulant formed over the first major surface of the substrate that covers the integrated circuit chip, the plurality of conductive vias, the at least one conductive trace, and the electrical connections between the integrated circuit chip and the plurality of conductive vias.

* * * * *